United States Patent
Yoo et al.

(10) Patent No.: US 9,159,795 B2
(45) Date of Patent: Oct. 13, 2015

(54) HIGH SIDE DMOS AND THE METHOD FOR FORMING THEREOF

(71) Applicant: Monolithic Power Systems, Inc., San Jose, CA (US)

(72) Inventors: Ji-Hyoung Yoo, Cupertino, CA (US); Lei Zhang, Chengdu (CN); Daping Fu, Chengdu (CN); Yanjie Lian, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 53 days.

(21) Appl. No.: 13/931,652

(22) Filed: Jun. 28, 2013

(65) Prior Publication Data

US 2015/0001619 A1   Jan. 1, 2015

(51) Int. Cl.
| | |
|---|---|
| *H01L 29/40* | (2006.01) |
| *H01L 29/06* | (2006.01) |
| *H01L 29/10* | (2006.01) |
| *H01L 29/78* | (2006.01) |
| *H01L 29/66* | (2006.01) |

(52) U.S. Cl.
CPC .......... *H01L 29/402* (2013.01); *H01L 29/0623* (2013.01); *H01L 29/1095* (2013.01); *H01L 29/66681* (2013.01); *H01L 29/7823* (2013.01)

(58) Field of Classification Search
CPC ......... H01L 29/40; H01L 29/06; H01L 29/10; H01L 29/78; H01L 29/66
USPC ................. 257/339, 335, 341, 342, 337, 504; 438/416
See application file for complete search history.

(56) References Cited

U.S. PATENT DOCUMENTS

| | | | |
|---|---|---|---|
| 6,252,278 B1 | 6/2001 | Hsing | |
| 6,462,378 B1 * | 10/2002 | Kim | 257/342 |
| 2010/0032756 A1 * | 2/2010 | Pendharkar et al. | 257/337 |
| 2012/0211832 A1 * | 8/2012 | Chu et al. | 257/335 |
| 2012/0241862 A1 | 9/2012 | Zhang et al. | |
| 2013/0043534 A1 | 2/2013 | Disney et al. | |
| 2013/0153999 A1 | 6/2013 | Zhang et al. | |

* cited by examiner

*Primary Examiner* — Sheng Zhu
(74) *Attorney, Agent, or Firm* — Perkins Coie LLP

(57) ABSTRACT

A high side DMOS provides high breakdown voltage with small termination area. The high side DMOS has three parts which may comprise a stair-field plate in the termination part of the poly gate.

8 Claims, 10 Drawing Sheets

HIGH SIDE DMOS AND THE METHOD FOR FORMING THEREOF

TECHNICAL FIELD

The present invention relates to semiconductor devices, more specifically, the present invention relates to DMOS (Diffused Metal-Oxide Semiconductor) devices.

BACKGROUND

DMOS devices are widely used in circuits. Typically, for low-side DMOS, because the source potential may be at reference zero, both the source and body in termination are connected to an isolation ring. So no additional layer is needed to execute isolation with other devices or to improve the breakdown voltage. As a result, the termination area is quite small. However, for high-side DMOS, due to the high-side DMOS's work condition (e.g., the high voltage potential across the high-side DMOS and the source potential is float), full isolation is required). A common way to achieve full isolation is to extend the Nwell region, as shown in FIG. 1A, so that the source and body of the DMOS are enclosed by the Nwell region. However, this may cause low breakdown voltage between the Pbase region and the Nwell region in termination.

An improved way is to insert a Pwell region in the Nwell region in termination. As shown in FIG. 1B, the Pwell region 11 which partially surrounds the Pbase region 12 is embedded in the Nwell region 10. The Pbase region 12 acts as the body region. This approach changes Pbase-Nwell breakdown (the breakdown voltage between the Pbase region 12 and Nwell region 10) to Pwell-Nwell breakdown (the breakdown voltage between the Pwell region 11 and Nwell region 10). Generally, the Pwell-Nwell breakdown voltage is much higher than Pbase-Nwell breakdown voltage in DMOS. However, the inserted Pwell requires a large area and increases the size of the device.

SUMMARY

It is an object of the present invention to provide an improved high side DMOS device, to solve the above problems.

A high side DMOS has three parts which may comprise a stair-field plate in the termination part of the poly gate. The high side DMOS provides higher breakdown voltage with smaller termination area.

The use of the similar reference label in different drawings indicates the same of like components.

DETAILED DESCRIPTION

Embodiments of circuits/structures for high side DMOS are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1A:
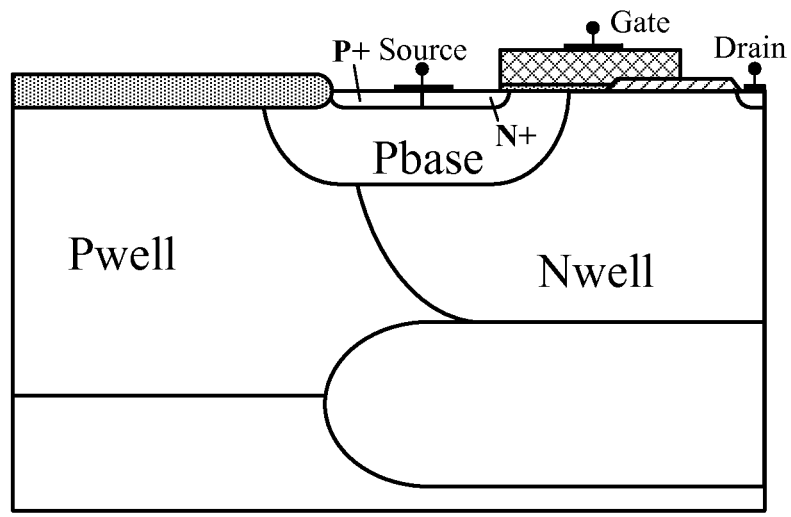
FIG. 1A schematically shows a cross-section view of a prior high side DMOS.
Figure 1B:
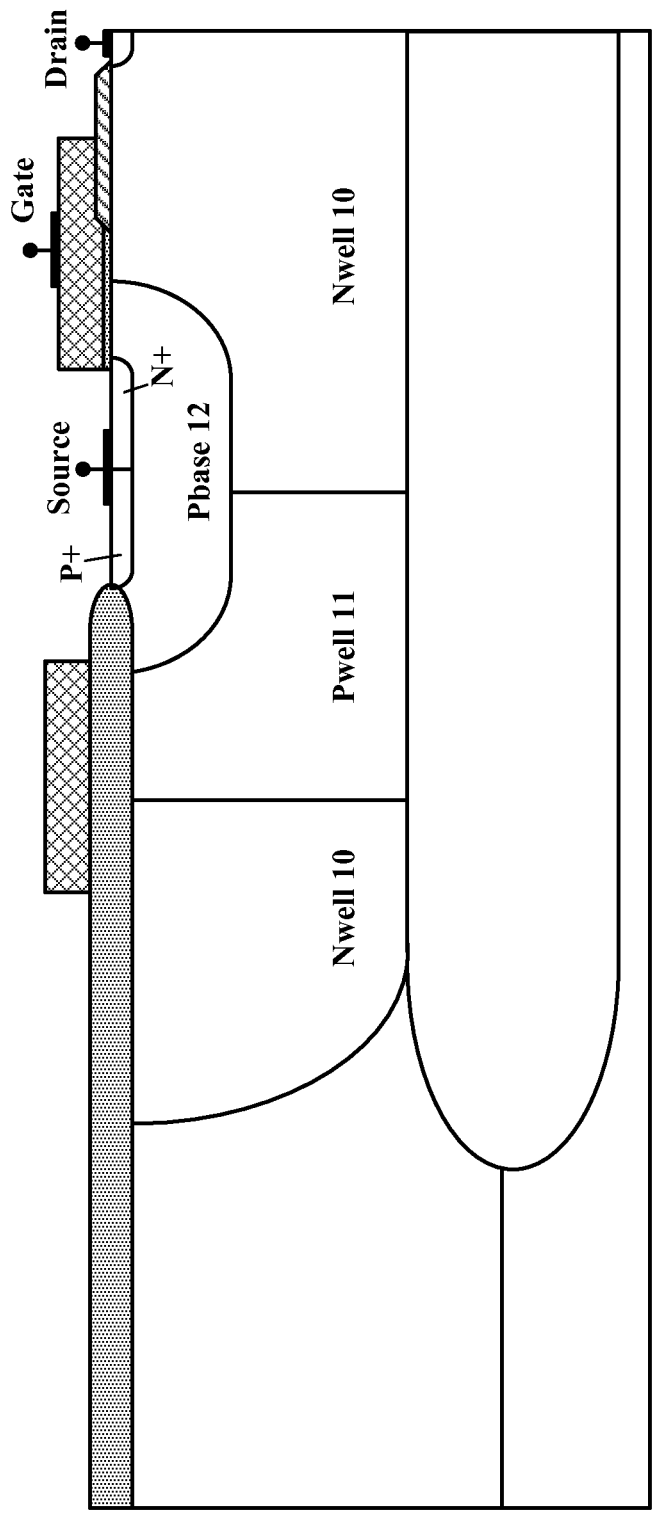
FIG. 1B schematically shows a cross-section view of another prior high side DMOS.
Figure 2:
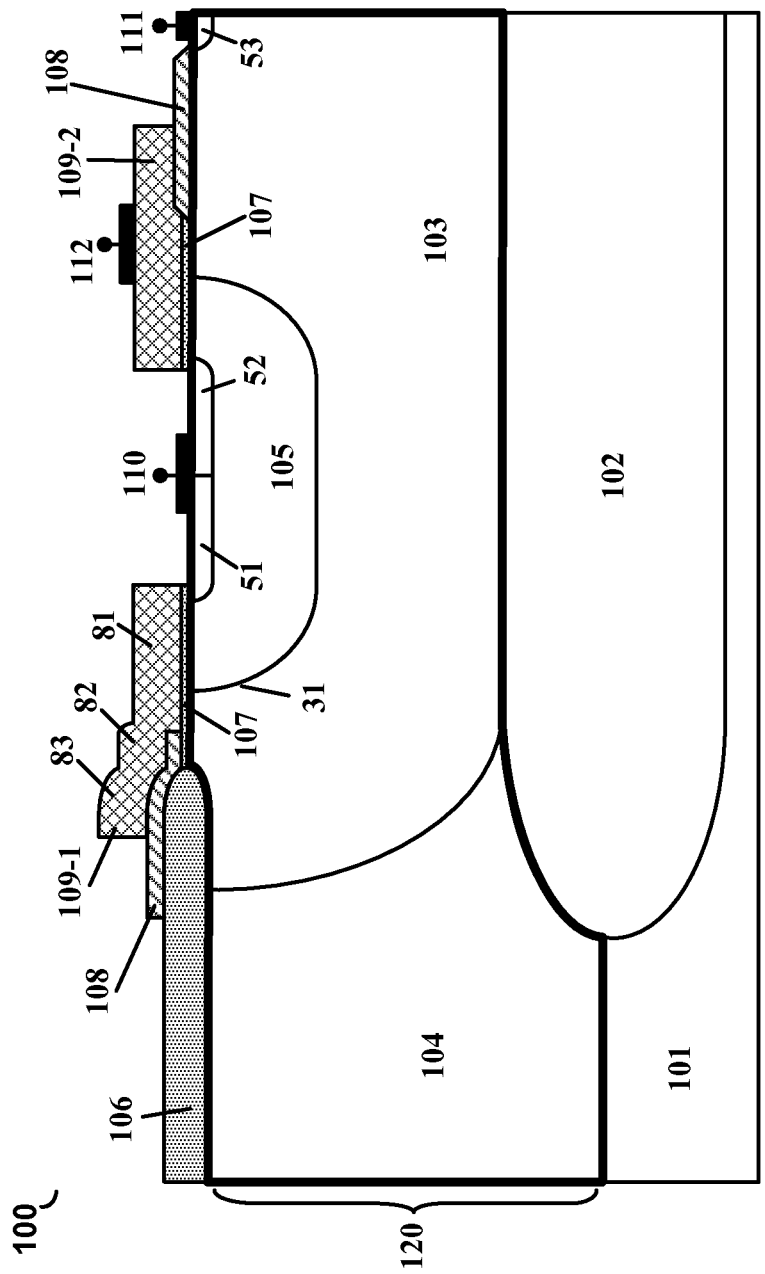
FIG. 2 schematically shows a cross-section view of a high side DMOS 100 in accordance with an embodiment of the present invention.

FIG. 2 schematically shows a cross-section view of a high side DMOS 100 in accordance with an embodiment of the present invention. As shown in FIG. 2, the high side DMOS 100 comprises: a substrate 101 of a first doping type; a buried layer 102 of a second doping type formed in the substrate 101; an epitaxial layer 120 formed on the substrate 101; a first well region 103 of the second doping type formed in the epitaxial layer 120; a second well region 104 of the first doping type formed in the epitaxial layer 120, wherein the second well region 104 is adjacent to the first well region 103; a base region 105 of the first doping type formed in the first well region 103, the base region 105 and the first well region 103 forming a body-well junction 31; a body pickup region 51 of the first doping type formed in the base region 105; a source pickup region 52 of the second doping type formed in the base region 105, wherein the source pickup region 52 is adjacent to the body pickup region 51; a drain pickup region 53 of the second doping type formed in the first well region 103; a field oxide 106 formed on the epitaxial layer 120; a gate oxide 107 formed on the epitaxial layer 120; a thick gate oxide 108, formed on part of the gate oxide 107, on part of the epitaxial layer 120 and on part of the field oxide 106; a gate poly, formed on the field oxide 106, on the gate oxide 107 and on the thick gate oxide 108, the gate poly comprising a termination part 109-1 and an ordinary part 109-2, wherein the termination part 109-1 comprises an active poly 81 across the body-well junction 31, a first extended poly 82 on the gate oxide 107 and on the thick gate oxide 108, and a second extended poly 83 on the thick gate oxide 108 and on the field oxide 106; a source electrode 110 contacted with the body pickup region 51 and with the source pickup region 52; a drain electrode 111 contacted with the drain pickup region 53; and a gate electrode 112 contacted with the ordinary part 109-2 of the gate poly.

In one embodiment, the first doping type is P type, and the second doping type is N type.

In one embodiment, the active poly 81, the first extended poly 82 and the second extended poly 83 comprise a stair-field plate.

In the example of FIG. 2, the field oxide 106 has no shallow-trench isolation (STI) structure. However, one skilled in the art should realize that the field oxide 107 may have a STI structure, as shown in FIG. 3.

Figure 3:
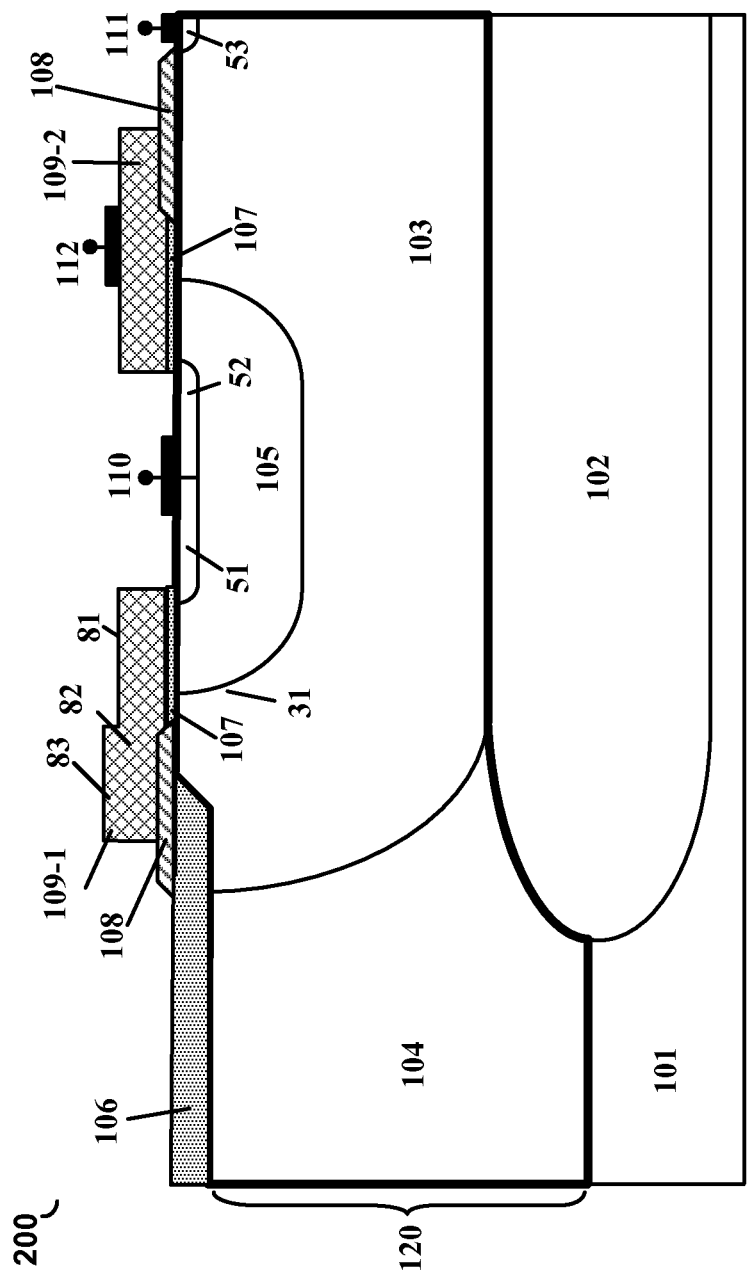
FIG. 3 schematically shows a cross-section view of a high side DMOS 200 in accordance with an embodiment of the present invention.

FIG. 3 schematically shows a cross-section view of a high side DMOS 200 in accordance with an embodiment of the present invention. The high side DMOS 200 in FIG. 3 is similar to the high side DMOS 100 in FIG. 2, with a difference that the field oxide 106 of the high side DMOS 200 in FIG. 3 has a STI structure.

Figure 4:
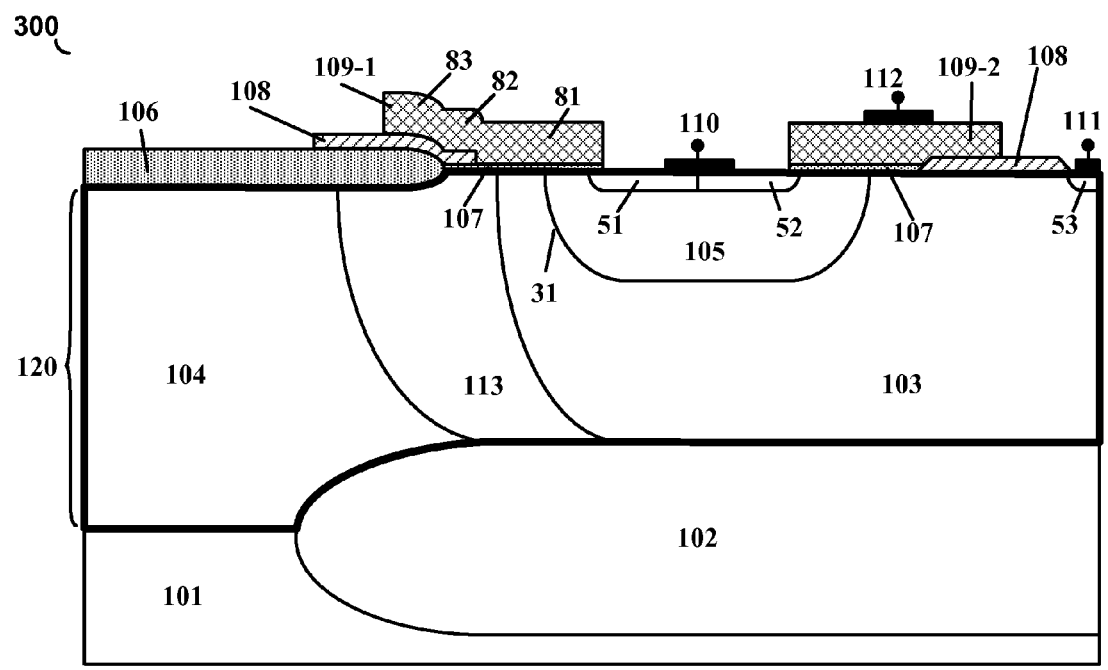
FIG. 4 schematically shows a cross-section view of a high side DMOS 300 in accordance with an embodiment of the present invention.

In one embodiment, the high side DMOS may further have a lightly doped well region surrounding the first well region. FIG. 4 schematically shows a cross-section view of a high side DMOS 300 in accordance with an embodiment of the present invention. The high side DMOS 300 in FIG. 4 is similar to the high side DMOS 100 in FIG. 2, with a difference that the high side DMOS 300 further comprises a lightly doped well region 113 of the second doping type formed in the epitaxial layer 120. The first well region 103 is surrounded by the lightly doped well region 113.

FIGS. 5-13 schematically show cross-section views of a semiconductor substrate undergoing a process for forming a high side DMOS device in accordance with an embodiment of the present invention.

Figure 5:
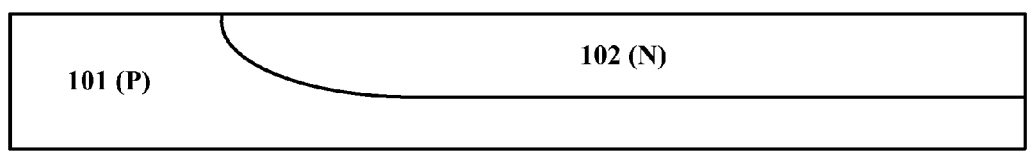
FIGS. 5-13 schematically show cross-section views of a semiconductor substrate undergoing a process for forming a high side DMOS device in accordance with an embodiment of the present invention.

As shown in FIG. 5, the process includes forming an N-type buried layer (NBL) 102 in the substrate 101.

Figure 6:
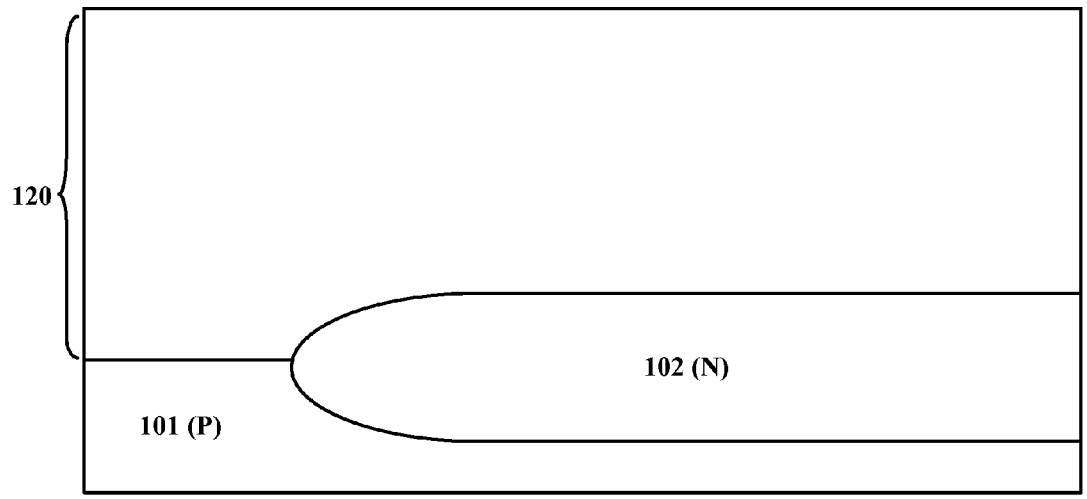

As shown in FIG. 6, the process includes forming an epitaxial layer 120 on the substrate 101. In one embodiment, the epitaxial layer 120 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the epitaxial layer 120 may be doped with P-type impurities. In other embodiments, the epitaxial layer 120 may be doped with N-type impurities. In one embodiment, during the forming of the epitaxial layer 120 and the following steps discussed later, the NBL 102 may get out-diffusion into the epitaxial layer 120. As shown in FIG. 6, the NBL 102 goes up into the epitaxial layer 120.

Figure 7:
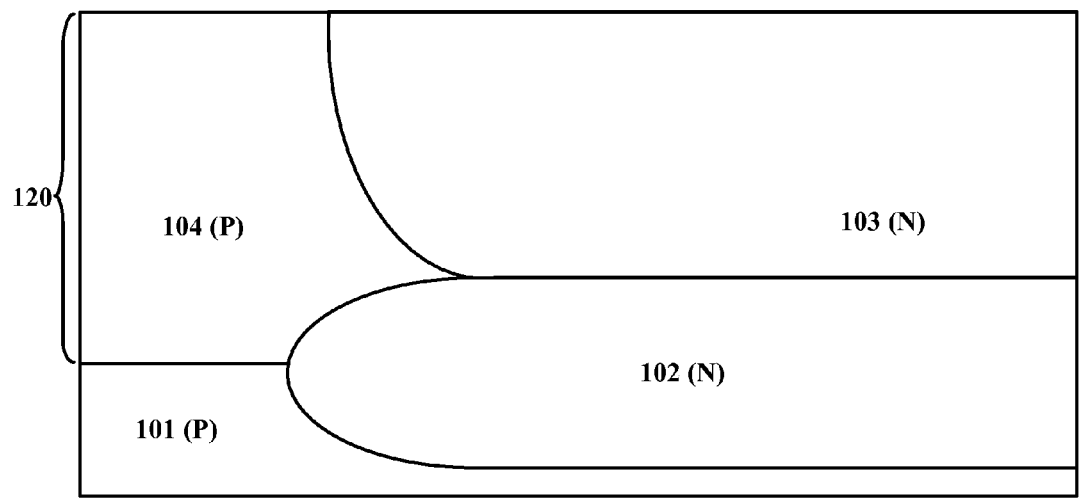

As shown in FIG. 7, the process includes forming an N well region 103 and a P well region 104 in the epitaxial layer 120. In one embodiment, the N well region 103 and P well region 104 may be formed by implantation technology or diffusion technology.

Figure 8:
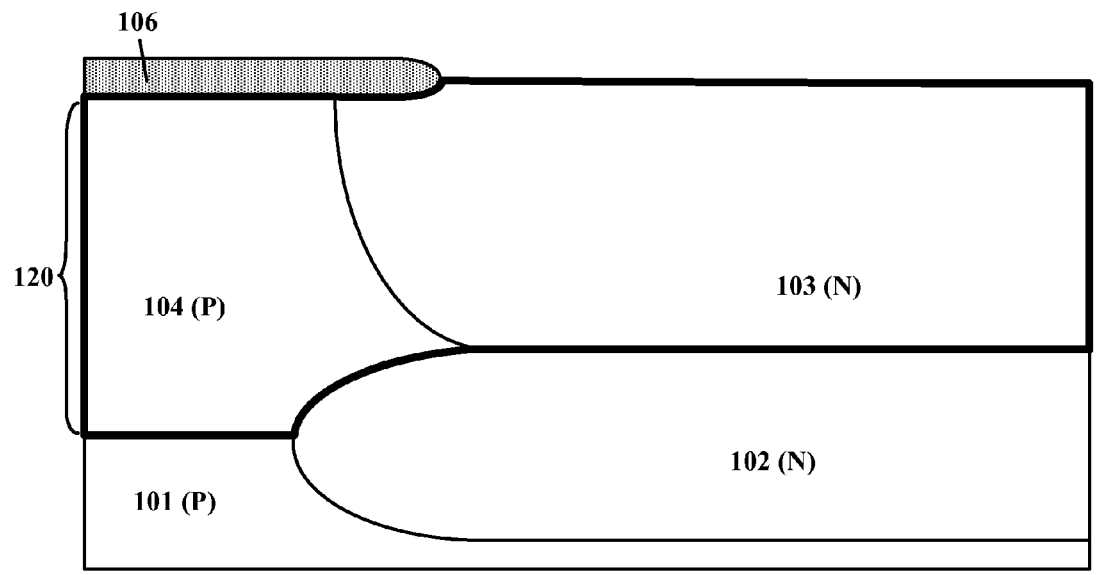

As shown in FIG. 8, the process includes forming a field oxide 106 on the epitaxial layer 120, wherein part of the epitaxial layer 120 is covered by the field oxide 106. In one embodiment, the field oxide 106 may be formed by wet oxidation technique. In the example of FIG. 8, the field oxide 102 is formed not as a shallow-trench isolation (STI) structure. However, in other embodiments, the field oxide 106 may be formed as a STI structure.

Figure 9A:
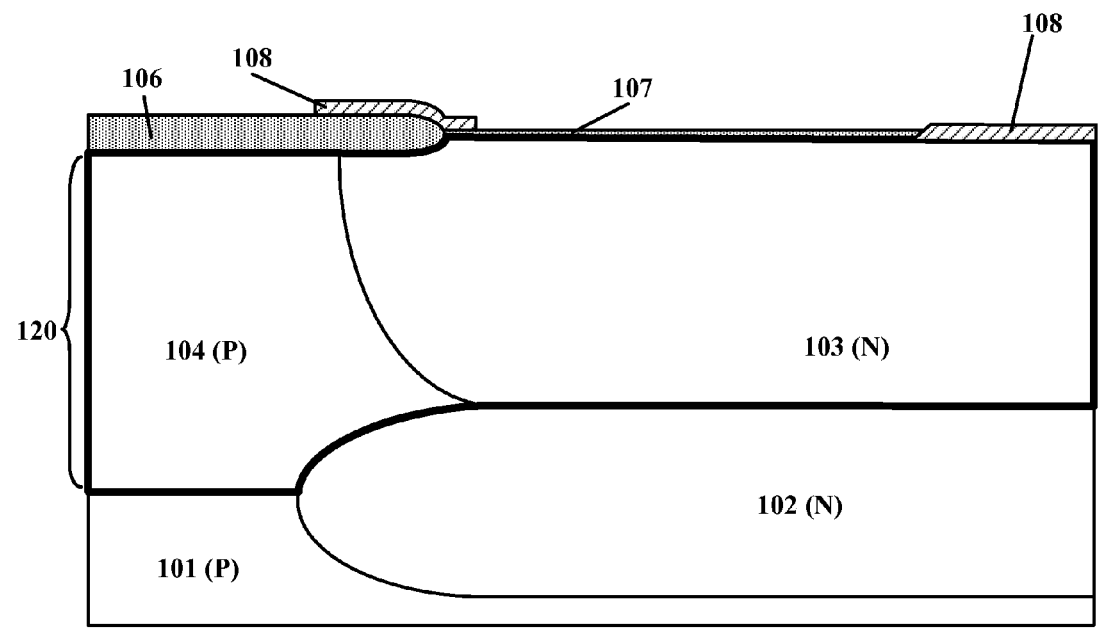
Figure 9B:
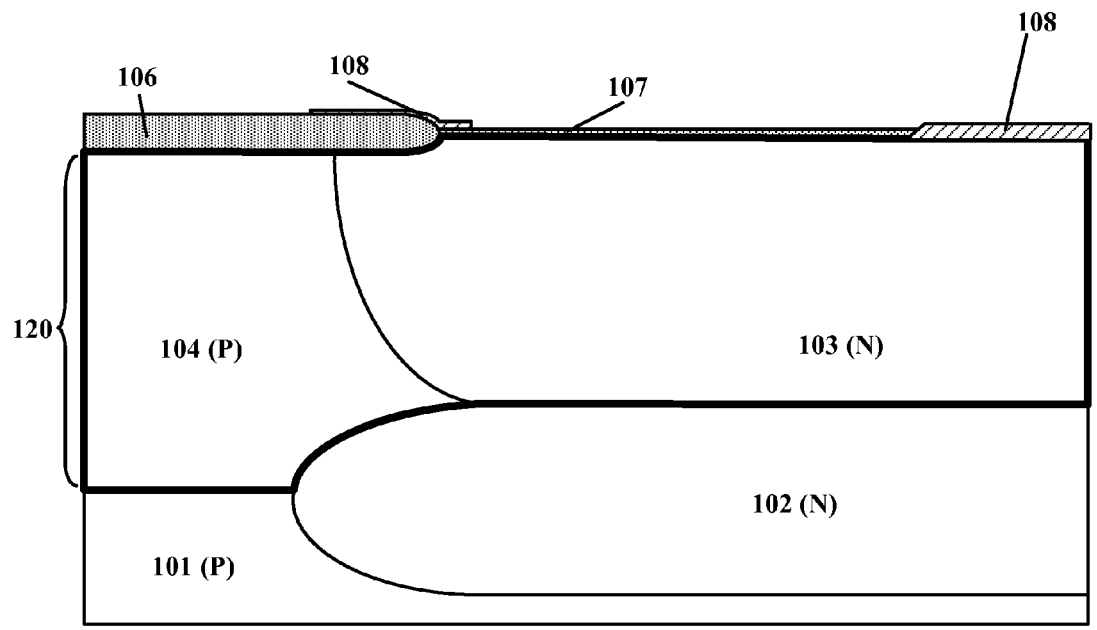

As shown in FIG. 9A, the process includes forming a gate oxide 107 on the epitaxial layer 120 and forming a thick gate oxide 108 on part of the field oxide 106, on part of the epitaxial layer 120 and on part of the gate oxide 107, wherein the epitaxial layer 120 other than the part covered by the field oxide 106 is covered by the gate oxide 107 and the thick gate oxide 108. In one embodiment, the gate oxide 107 may be formed by dry oxidation technology. In one embodiment, the thick gate oxide 108 may be formed by deposition technology. In other embodiments, the thick gate oxide 108 may be formed by thermal oxidation technology; and the thick gate oxide 108 may be faint, as shown in FIG. 9B.

Figure 10:
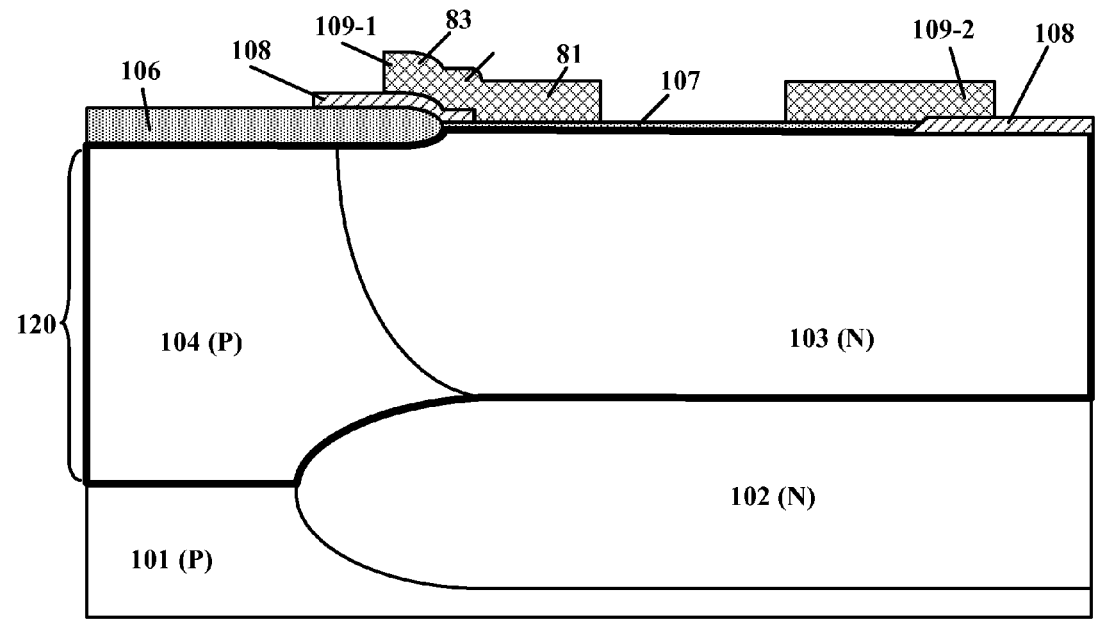

As shown in FIG. 10, the process includes forming a gate poly on the field oxide 106, on the gate oxide 107 and on the thick gate oxide 108, the gate poly comprising a termination part 109-1 and an ordinary part 109-2, the termination part 109-1 including an active poly 81, a first extended poly 82 on the gate oxide 107 and on the thick gate oxide 108, and a second extended poly 83 on the thick gate oxide 108 and on the field oxide 106. In one embodiment, the active poly 81, the first extended poly 82 and the second extended poly 83 present as stair-field plate.

Figure 11:
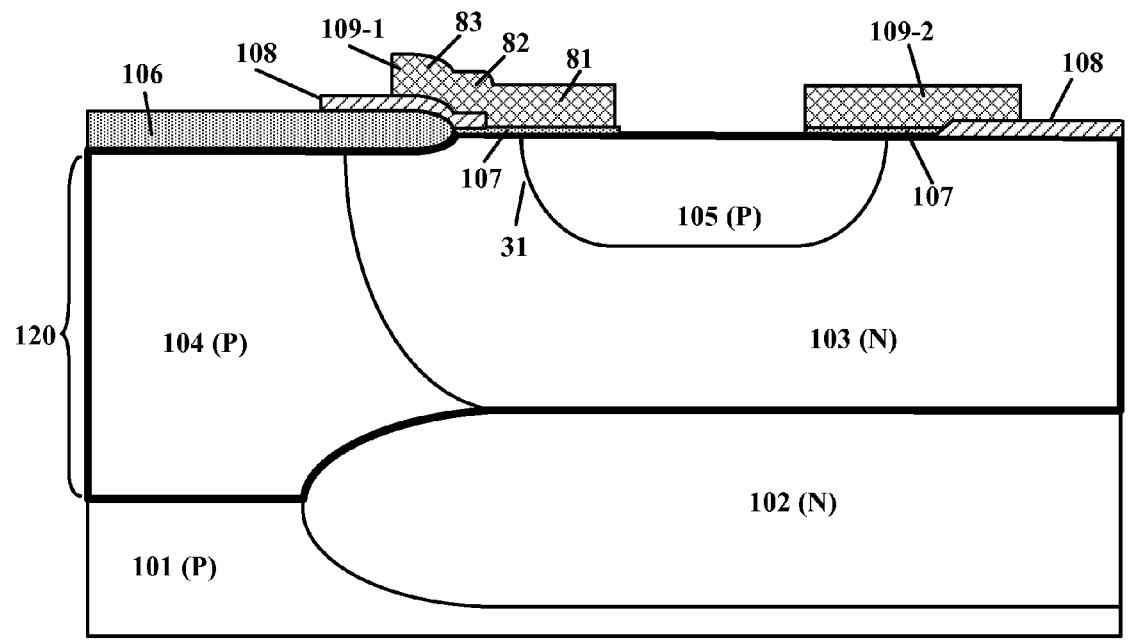

As shown in FIG. 11, the process includes forming a P base region 105 in the N well region 103. The P base region 105 and the N well region 103 form a base-well junction 31, and the base-well junction 31 is under the active poly 81. In one embodiment, the P base region 105 may be formed by implantation technology or diffusion technology.

Figure 12:
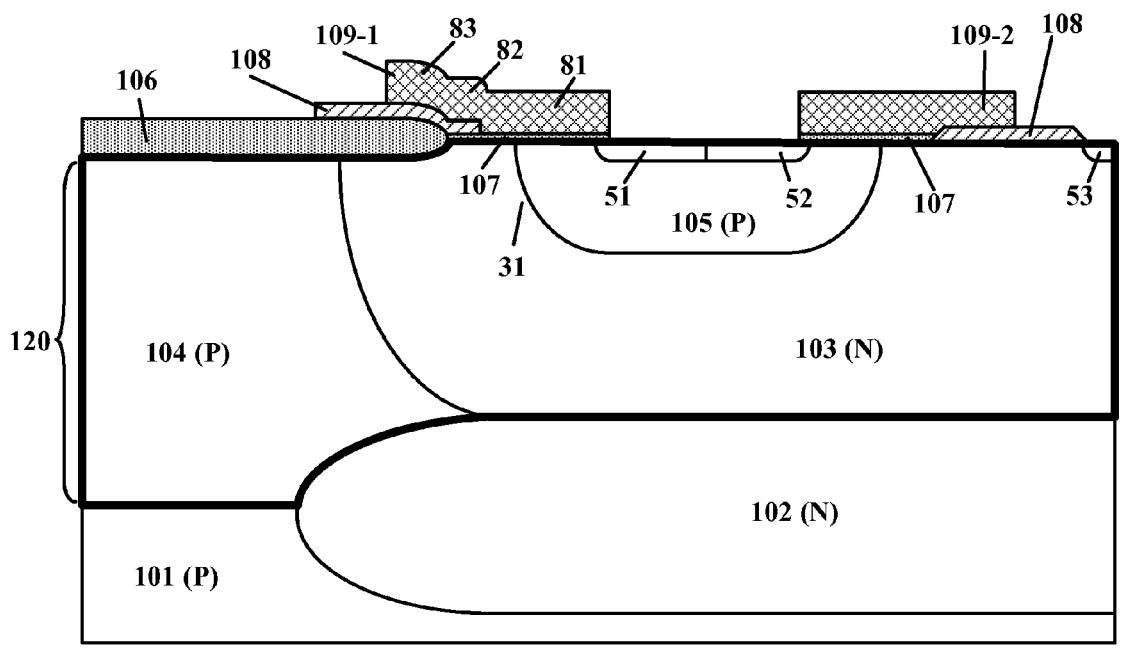

As shown in FIG. 12, the process includes forming a body pickup region 51 and a source pickup region 52 in the P base region 105, and forming a drain pickup region 53 in the N well region 103. The body pickup region 51 is with P-type impurities, the source pickup region 52 and the drain pickup region 53 are with N-type impurities. The source pickup region 52 is adjacent to the body pickup region 51. In one embodiment, part of the gate oxide 107 is removed before the formation of the body pickup region 51 and the source pickup region 52. In one embodiment, the body pickup region 51, the source pickup region 52 and the drain pickup region 53 may be formed by implantation technology.

Figure 13:
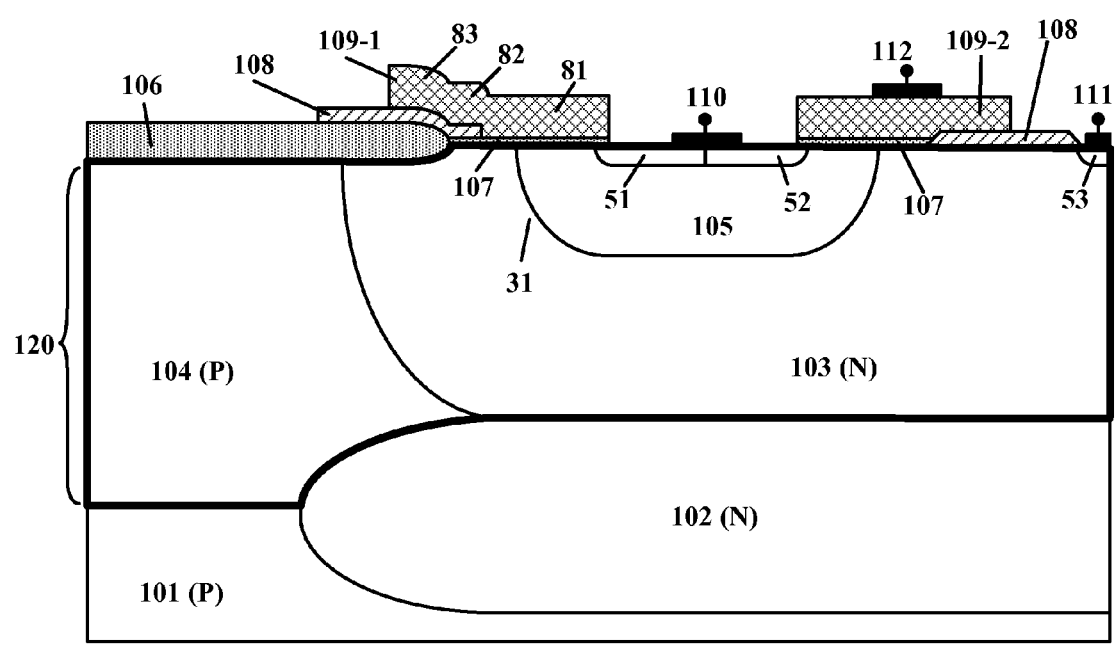

As shown in FIG. 13, the process includes forming a source electrode 110 contacted with the body pickup region 51 and with the source pickup region 52, forming a drain electrode 111 contacted with the drain pickup region 53, and forming a gate electrode 112 contact with the ordinary part 109-2 of the gate poly.

In one embodiment, the process may further comprise forming an N-type lightly doped well region in the epitaxial layer 120 before the formation of the N well region 103, wherein the N well region 103 is formed in the N-type lightly doped well region, e.g., the N well region 103 is partial of the N-type lightly doped well region. In one embodiment, the N-type lightly doped region may be formed by diffusion technology or implantation technology.

Several embodiments of the foregoing high side DMOS has high breakdown voltage with small termination area compared to conventional high side DMOS. Unlike the conventional technique, several embodiments of the foregoing high side DMOS have three parts in the termination part of the poly gate. In addition, the three parts in the termination part of the poly gate may comprise a stair-field plate, which increases the base-well breakdown voltage with small termination area.

This written description uses examples to disclose the invention, including the best mode, and also to enable a person skilled in the art to make and use the invention. The patentable scope of the invention may include other examples that occur to those skilled in the art.

We claim:

1. A high side DMOS, comprising:
a substrate of a first doping type;
a buried layer of a second doping type formed in the substrate;
an epitaxial layer formed on the substrate;
a first well region of the second doping type formed in the epitaxial layer;
a second well region of the first doping type formed in the epitaxial layer, the second well region being adjacent to the first well region;
a base region of the first doping type formed in the first well region, the base region and the first well region forming a body-well junction;
a body pickup region of the first doping type formed in the base region;
a source pickup region of the second doping type formed in the base region, the source pickup region being adjacent to the body pickup region;
a drain pickup region of the second doping type formed in the first well region;
a field oxide formed on the epitaxial layer;
a gate oxide formed on the epitaxial layer;
a thick gate oxide formed on part of the gate oxide, on part of the epitaxial layer and on part of the field oxide;

a gate poly formed on the field oxide, on the gate oxide and on the thick gate oxide, the gate poly comprising a termination part and an ordinary part, the termination part including an active poly across the body-well junction, a first extended poly on the gate oxide and on the thick gate oxide, and a second extended poly on the thick gate oxide and on the field oxide, wherein the active poly, the first extended poly and the second extended poly are continuous and present as stair-field plate;

a source electrode contacted with the body pickup region and with the source pickup region;

a drain electrode contacted with the drain pickup region; and a gate electrode contacted with the ordinary part of the gate poly.

2. The high side DMOS of claim 1, wherein the field oxide has no shallow-trench isolation structure.

3. The high side DMOS of claim 1, wherein the field oxide has a shallow-trench isolation structure.

4. The high side DMOS of claim 1, further comprising:
a lightly doped well region of the second doping type formed in the epitaxial layer, wherein the first well region is surrounded by the lightly doped well region.

5. A high side DMOS, comprising:
a substrate of a first doping type;
an epitaxial layer formed on the substrate;
a first well region of a second doping type formed in the epitaxial layer;
a second well region of the first doping type formed in the epitaxial layer;
a base region of the first doping type formed in the first well region, the base region and the first well region forming a body-well junction;
a field oxide formed on the epitaxial layer;
a gate oxide formed on the epitaxial layer;
a thick gate oxide formed on part of the gate oxide, on part of the epitaxial layer and on part of the field oxide; and
a gate poly formed on the field oxide, on the gate oxide and on the thick gate oxide, the gate poly comprising a termination part and an ordinary part, the termination part including an active poly across the body-well junction, a first extended poly on the gate oxide and on the thick gate oxide, and a second extended poly on the thick gate oxide and on the field oxide, wherein the active poly, the first extended poly and the second extended poly are continuous and present as stair-field plate.

6. The high side DMOS of claim 5, further comprising:
a buried layer of the second doping type formed in the substrate.

7. The high side DMOS of claim 5, further comprising:
a lightly doped well region of the second doping type formed in the epitaxial layer, wherein the first well region is surrounded by the lightly doped well region.

8. The high side DMOS of claim 5, further comprising:
a body pickup region of the first doping type formed in the base region;
a source pickup region of the second doping type formed in the base region, the source pickup region being adjacent to the body pickup region;
a drain pickup region of the second doping type formed in the first well region;
a source electrode contacted with the body pickup region and with the source pickup region;
a drain electrode contacted with the drain pickup region; and
a gate electrode contacted with the ordinary part of the gate poly.

* * * * *